(12) United States Patent
Hunter et al.

(10) Patent No.: US 7,288,424 B2
(45) Date of Patent: Oct. 30, 2007

(54) INTEGRATED DRIVER PROCESS FLOW

(75) Inventors: James A. Hunter, Campbell, CA (US);
Charles B. Roxlo, Saratoga, CA (US);
Alexander Payne, Ben Lomond, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 202 days.

(21) Appl. No.: 10/720,498

(22) Filed: Nov. 24, 2003

(65) Prior Publication Data

US 2004/0106221 A1 Jun. 3, 2004

Related U.S. Application Data

(63) Continuation-in-part of application No. 10/161,191, filed on May 28, 2002, now Pat. No. 6,767,751.

(51) Int. Cl.
*H01L 21/00* (2006.01)

(52) U.S. Cl. .................. 438/48; 438/52; 438/53; 257/E21.487

(58) Field of Classification Search ............ 438/48–54; 257/E21.481, E21.518
See application file for complete search history.

(56) References Cited

U.S. PATENT DOCUMENTS

| | | | |
|---|---|---|---|
| 4,571,661 A * | 2/1986 | Hoshino ................. 361/283.1 |
| 5,814,554 A * | 9/1998 | De Samber et al. ........ 438/611 |
| 6,430,109 B1 * | 8/2002 | Khuri-Yakub et al. ...... 367/181 |
| 6,448,622 B1 * | 9/2002 | Franke et al. ............. 257/415 |
| 6,773,401 B1 * | 8/2004 | Dreschel et al. ........... 600/459 |
| 6,884,636 B2 * | 4/2005 | Fiorini et al. .............. 438/14 |

* cited by examiner

*Primary Examiner*—H. Jey Tsai
(74) *Attorney, Agent, or Firm*—Okamoto & Benedicto LLP

(57) ABSTRACT

An integrated device includes one or more device drivers and a micro-electro-mechanical system (MEMS) structure monolithically coupled to the one or more device drivers. The one or more device drivers are configured to process received control signals and to transmit the processed control signals to the MEMS structure. Methods of fabricating integrated devices are also disclosed.

11 Claims, 10 Drawing Sheets

INTEGRATED DRIVER PROCESS FLOW

REFERENCE TO RELATED APPLICATION

This application is a continuation-in-part of U.S. application Ser. No. 10/161,191, filed on May 28, 2002 now U.S. Pat. No. 6,767,751 by James A. Hunter.

FIELD OF THE INVENTION

The present invention relates to integrated devices and processes for manufacturing same.

BACKGROUND OF THE INVENTION

A diffractive light modulator is used to modulate an incident beam of light. One such diffractive light modulator is the Grating Light Valve™ (GLV™) device of Silicon Light Machines, Inc. of Sunnyvale, Calif. Device drivers provide control signals to the diffractive light modulator which instruct the diffractive light modulator to appropriately modulate the light beam incident thereto. The diffractive light modulator is connected to the device drivers via wire bonds, where each wire bond is connected to one bond pad on the diffractive light modulator and a corresponding bond pad on the device drivers. A conventional diffractive light modulator assembly, as illustrated in FIG. 1, consists of a diffractive light modulator chip 10 and four separate driver die 12, 14, 16 and 18. Each driver die 12, 14, 16 and 18 is coupled to the diffractive light modulator chip 10 by a plurality of wire bonds 11. The diffractive light modulator is built on its own process on silicon. The diffractive light modulator includes moveable elements and each element is connected to a corresponding bond pad. The diffractive light modulator is an essentially passive device where voltage is applied to make the elements move. In contrast, the device drivers are active. Each of the device drivers includes a plurality of transistors with appropriate layers of interconnects. The device drivers receive digital data and convert it to an analog response in the form of analog voltage. The analog voltage is then applied to the appropriate bond pad, which is then received by the corresponding element on the diffractive light modulator. In this manner, the device drivers provide control signals to the diffractive light modulator, thereby dictating the movement of the various elements.

In the field of light modulating devices, each element on the diffractive light modulator corresponds to a pixel within the light modulating device. For example, in the case of 1088 pixels, 1088 wire bonds are needed as input to the diffractive light modulator from the device drivers. 1088 wire bonds requires 272 bond pads on the output side of each of the four device drivers. However, it is much easier to perform high density wiring using standard semiconductor processing steps then it is to do wire bonding. Since only 60-70 wire bonds are necessary on the input side of each of the device drivers, it would be advantageous to internally wire the connections between the device drivers and the diffractive light modulator on the same chip. In this manner, it would only be necessary to have the 60-70 wire bonds as inputs to this integrated chip, thereby eliminating the additional 1088 wire bonds of the conventional diffractive light modulator assembly. By reducing the number of wire bonds, the manufacturing process is made easier. Further, fewer wire bonds reduces the packaging cost of each device. Still further, by eliminating the wire bonds between the device drivers and the diffractive light modulator, types of device driver designs whose functionality and/or speed was previously limited by the parasitic capacitance or inductance of the wire bonds can now be used.

There is also a reliability problem associated with such a high number of wire bonds. Since there is a finite failure rate associated with each wire bond, the more wire bonds there are, the greater the chance that one of the wire bonds will fail. Reducing the number of wire bonds would necessarily reduce the number of failing wire bonds, and increase the reliability of the device. Physically, each bond pad leaves a footprint. As such, the size of the diffractive light modulator assembly is determined in great part by the total number of bond pads. If the number of bond pads is reduced, the size of the diffractive light modulator assembly can also be reduced. As the device is bond pad limited, there is a significant amount of wasted real estate. Since this wasted real estate exists on silicon which can be used to manufacture the device drivers, the device drivers could be manufactured on the real estate currently being used by the bond pads.

Electro-static discharge (ESD) protection is usually incorporated into active devices ranging from diodes to transistors and integrated circuits. It is a matter of layout and design to add ESD protection structures to the pad during transistor fabrication on the integrated circuits. This protection prevents the circuitry from being damaged by ESD. However, since there is no active device on the diffractive light modulator chip, there is no ESD protection. As a result, a significant amount of yield is lost during manufacturing of the diffractive light modulators due to ESD induced "snap-downs." In a snap-down, the pad on the diffractive light modulator acts as an antenna and sees an ESD event. The ESD event is regarded as a voltage by the element on the diffractive light modulator and the element is snapped down thereby destroying itself. It would be advantageous to incorporate ESD protection into the normal manufacturing process of the diffractive light modulator.

Considering the above shortcomings, it is clear that if the device drivers are integrated onto the same silicon monolithically with the diffractive light modulator, then this would produce a significant advantage.

Unfortunately, the manufacturing processes of the device drivers and the diffractive light modulator are not the same. Further, by integrating the device drivers and the diffractive light modulator onto the same silicon substrate, significant manufacturing problems are introduced.

Conventional transistor manufacturing processes are described below in relation to FIGS. 2 and 3. FIG. 2 illustrates an exemplary transistor used in the device drivers of the diffractive light modulator assembly. The transistor illustrated in FIG. 2 is early in the manufacturing process and is often referred to as the front-end of the transistor. In a first step, silicon dioxide films 22 are grown on a silicon substrate 20. Next, a gate 24 and source-drain 26 are added by manufacturing processes that are well known in the art of semiconductor fabrication. A next step, as illustrated in FIG. 3, is deposition of an oxide layer 30 over the front-end of the transistor. The oxide layer 30 is then planarized, typically by a chemical-mechanical polishing technique. Contact holes are then etched in the oxide layer 30 to access the gate 24 and the silicon substrate 20, for example. Metalization is performed for the wiring of the device drivers. Metalization is typically performed by sputtering a metal layer over the oxide layer 30, patterning and etching the metal layer to form contacts 32 and 34. Another oxide layer 36 is then deposited and planarized. Contact holes are etched in the oxide layer 36 to access the contacts 32 and 34. Metalization is then performed to form the contacts 38 and 40. Additional layers of oxide and metalization are added as determined by the design considerations of the device. Typically, there are 3-5 layers of metal which form the interconnects of the device drivers.

Conventional diffractive light modulator manufacturing processes are described below in relation to FIGS. 4-7. The first step, as illustrated in FIG. 4, is the deposition of an insulating layer 51 followed by the deposition of a sacrificial layer 52 and a silicon nitride film 54 on a silicon substrate 56.

In a second step, as illustrated in FIG. 5, the silicon nitride film 54 is lithographically patterned into a grid of grating elements in the form of elongated elements 58. After this lithographic patterning process, a peripheral silicon nitride frame 60 remains around the entire perimeter of the upper surface of the silicon substrate 56. After the patterning process of the second step, the sacrificial layer 52 is etched, resulting in the configuration illustrated in FIG. 6. It can be seen that each element 58 now forms a free standing silicon nitride bridge. The elements of a diffractive light modulator, such as elements 58, are also referred to as "ribbons". As can further be seen from FIG. 6, the sacrificial layer 52 is not entirely etched away below the frame 60 and so the frame 60 is supported above the silicon substrate 56 by this remaining portion of the sacrificial layer 52.

The last fabrication step, as illustrated in FIG. 7, is sputtering of an aluminum film 62 to enhance the reflectance of both the elements 58 and the substrate 56 and to provide a first electrode for applying a voltage between the elements and the substrate. A second electrode is formed by sputtering an aluminum film 64 onto the base of the silicon substrate 56. Alternatively, the second electrode can be introduced earlier in the process by sputtering an aluminum film onto the upper portion of the silicon substrate 56 prior to deposition of the insulating layer 51.

In FIGS. 8 and 9, an alternative embodiment of a conventional diffractive light modulator is illustrated. In this embodiment the diffractive light modulator consists of a plurality of equally spaced, equally sized, fixed elements 72 and a plurality of equally spaced, equally sized, movable elements 74 in which the movable elements 74 lie in the spaces between the fixed elements 72. Each fixed element 72 is supported on and held in position by a body of supporting material 76 which runs the entire length of the fixed element 72. The bodies of material 76 are formed during a lithographic etching process in which the material between the bodies 76 is removed.

The problem is how to manufacture the diffractive light modulator on the same chip as the transistors that comprise the device drivers. Combining a diffractive light modulator and its associated device drivers onto a monolithically integrated device using conventional manufacturing process steps would be advantageous.

SUMMARY OF THE INVENTION

The present invention includes an embodiment of a method of fabricating an integrated device. The method preferably comprises fabricating a front-end portion for each of a plurality of transistors, isolating the front-end portions of the plurality of transistors, fabricating a front-end portion of a diffractive light modulator, isolating the front end portion of the diffractive light modulator, fabricating interconnects for the plurality of transistors, applying an open array mask and wet etch to access the diffractive light modulator, and fabricating a back-end portion of the diffractive light modulator, thereby monolithically coupling the diffractive light modulator and the plurality of transistors. The plurality of transistors and the associated interconnects can form one or more device drivers configured to process received control signals and to transmit the processed control signals to the diffractive light modulator. Fabricating the front-end portion of the diffractive light modulator and fabricating the front-end portions for the plurality of transistors can be performed using high temperature processing steps. Fabricating interconnects and fabricating the back-end portion of the diffractive light modulator can be performed using low temperature processing steps. Isolating the front-end portions of the plurality of transistors can include depositing an oxide layer over the front-end portions of the plurality of transistors, and planarizing the oxide layer. Isolating the front-end portion of the diffractive light modulator can include depositing an oxide layer over the front-end portion of the diffractive light modulator, and planarizing the oxide layer.

Fabricating the interconnects can include fabricating one or more metal layers. The preferred method can also include removing metal from above the diffractive light modulator after each metal layer is fabricated. Each metal layer can be removed from above the diffractive light modulator by over-etching and the oxide layer deposited over the front-end portion of the diffractive light modulator is sufficiently thick as to allow for over-etching without damaging the front-end portion of the diffractive light modulator. The interconnects for the plurality of transistors can include contacts to each of the plurality of transistors. The contacts can include a maximum aspect ratio that limits a maximum combined thickness of the oxide layer over the front-end portions of the plurality of transistors and the oxide layer over the front end portion of the diffractive light modulator. The diffractive light modulator and the plurality of transistors are monolithically coupled to transmit control signals from the plurality of transistors to the diffractive light modulator such that the diffractive light modulator modulates an incident light beam in response to the control signals. The wet etch preferably comprises about a 10:1 buffered oxide wet etch to selectively etch the layers above the diffractive light modulator.

The present invention includes an embodiment of an integrated device. The integrated device includes one or more device drivers and a diffractive light modulator monolithically coupled to the one or more driver circuits. The one or more driver circuits are preferably configured to process received control signals and to transmit the processed control signals to the diffractive light modulator.

The present invention may be employed in the fabrication of a variety of integrated devices including pressure transducers and capacitive micromachined ultrasonic transducers (CMUTs).

DETAILED DESCRIPTION OF THE EMBODIMENTS

The fabrication steps required to produce a monolithically integrated diffractive light modulator and device drivers according to the preferred embodiment of the present invention are illustrated in FIGS. 10-20. Specifically, the fabrication process begins with a front-end fabrication process, which is illustrated in FIGS. 10-14. The fabrication process is completed with a back-end fabrication process, which is illustrated in FIGS. 15-20. The front-end fabrication process includes fabrication of the front-end of the transistors, which form the device drivers and fabrication of the front-end of the diffractive light modulator. The fabrication of the front-end of the transistors and the front-end of the diffractive light modulator are performed using high-temperature process steps. The back-end fabrication process includes the metalization of the transistor interconnects and the metalization of the diffractive light modulator. Metalization is performed using low-temperature process steps. The total thermal budget associated with the fabrication of the monolithically integrated device must take into consideration the thermal budgets associated with each of the high-temperature process steps as well as each of the low-temperature process steps.

Figure 1:
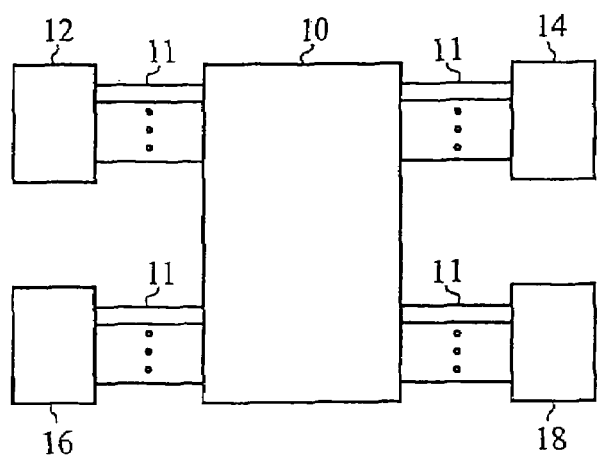
FIG. 1 illustrates a conventional component configuration in which a diffractive light modulator is connected to separate device drivers.
Figure 2:
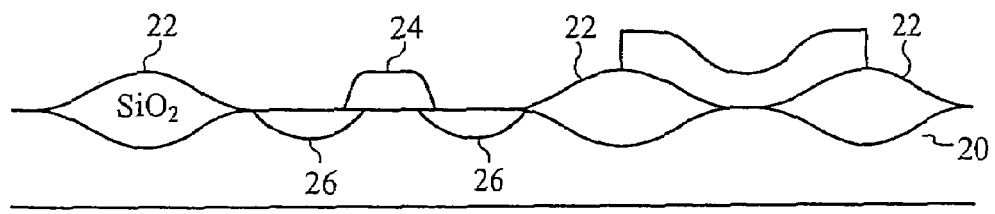
FIG. 2 illustrates an exemplary transistor configuration without interconnects.
Figure 3:
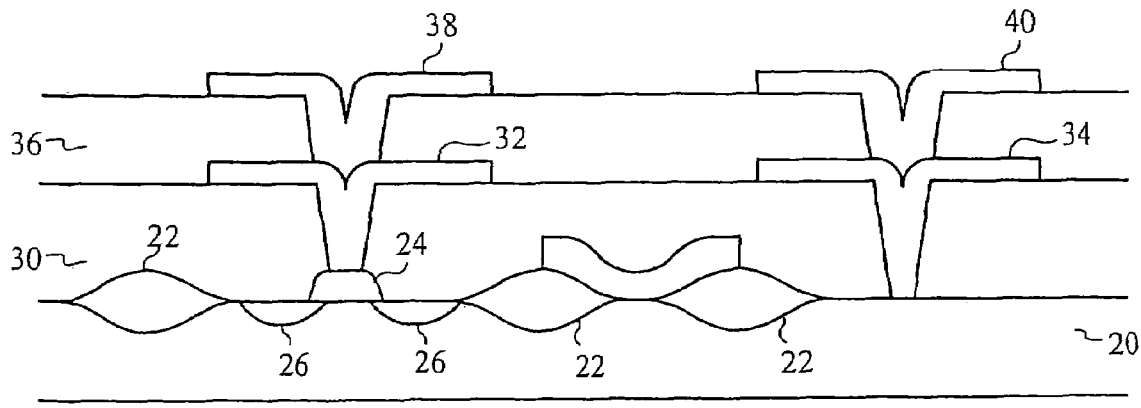
FIG. 3 illustrates the exemplary transistor configuration of FIG. 2 with interconnects.
Figure 4:
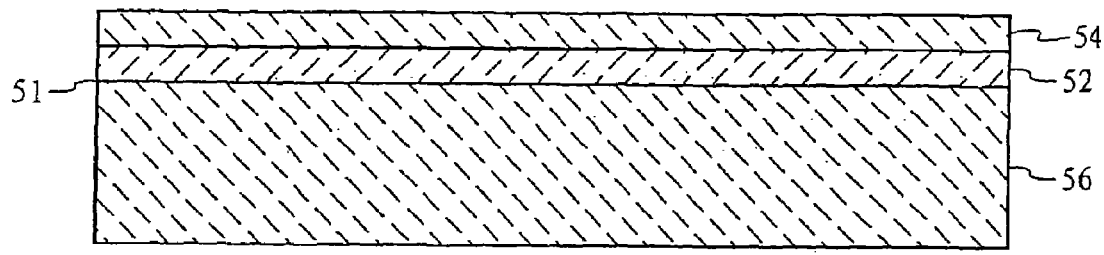
FIGS. 4-7 are cross-sections through a silicon substrate illustrating the manufacturing process of a conventional reflective, deformable, diffraction light grating.
Figure 5:
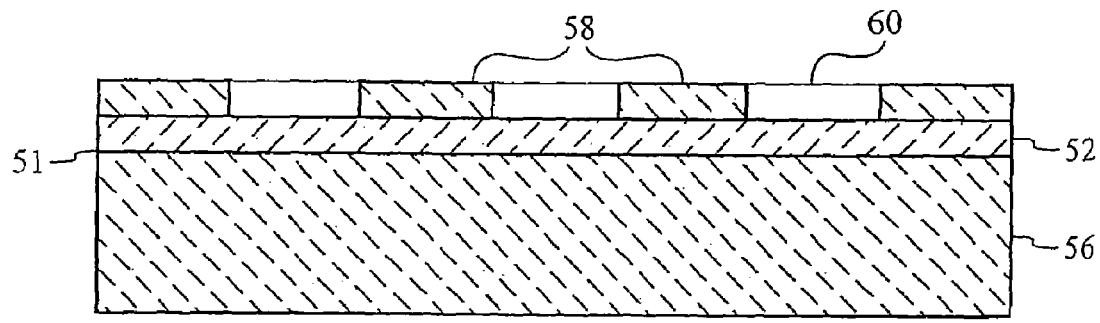
Figure 6:
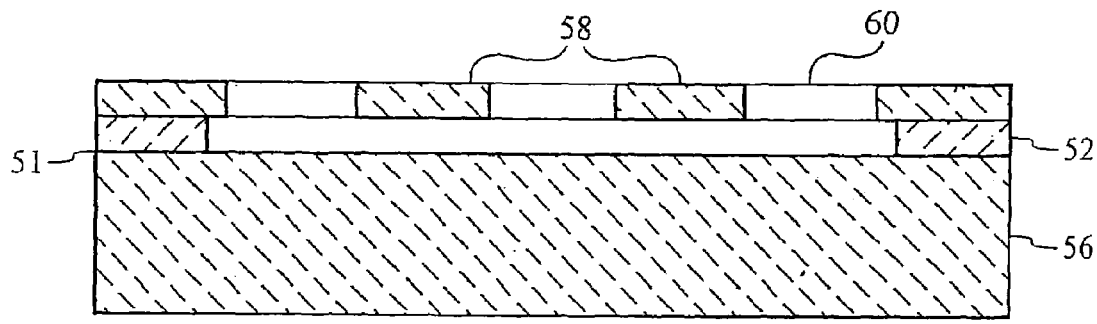
Figure 7:
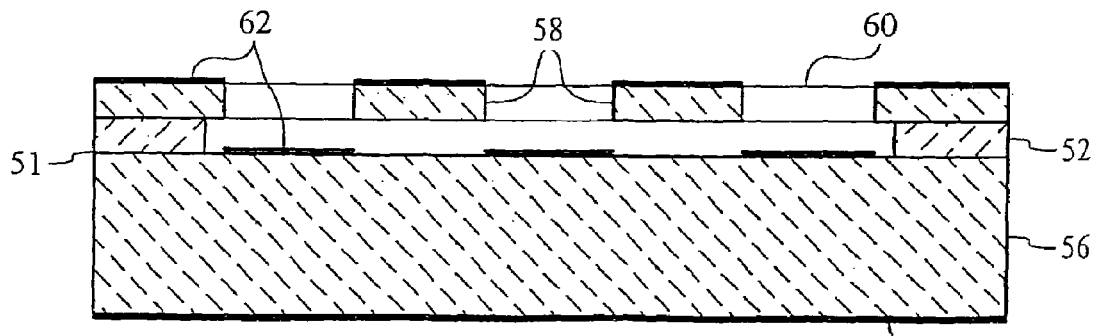
Figure 8:
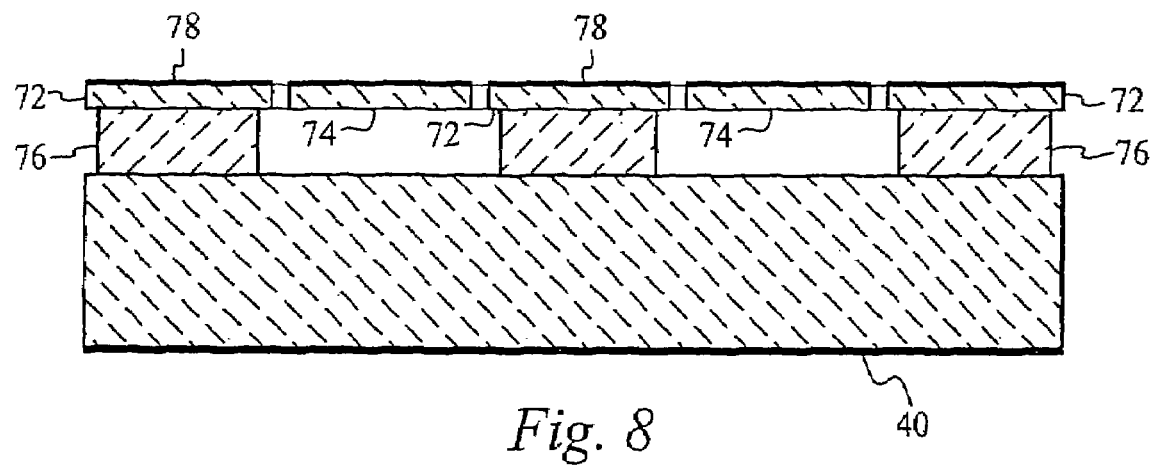
FIG. 8 is a cross-section similar to that in FIG. 7, illustrating an alternative embodiment of a conventional diffractive light modulator in a non-diffracting mode.
Figure 9:
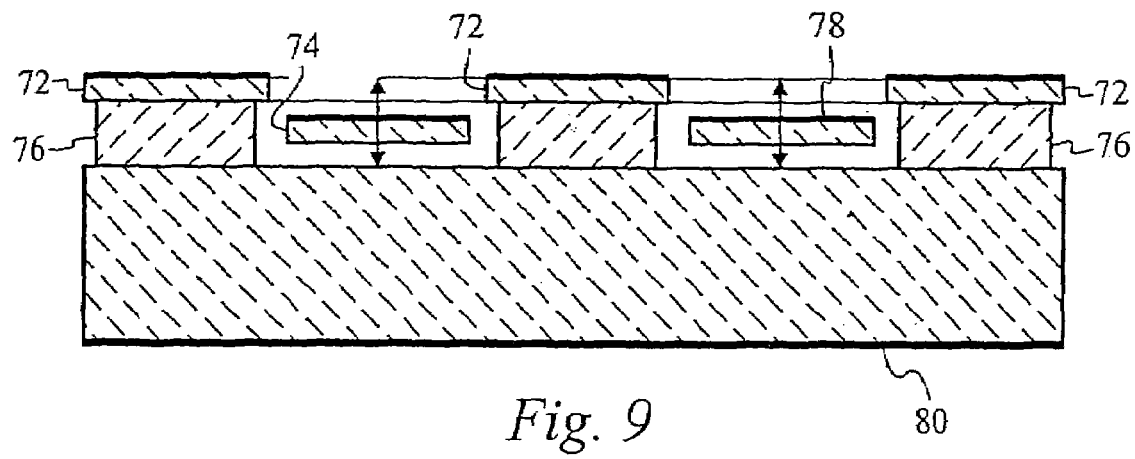
FIG. 9 is a cross-section of the diffractive light modulator shown in FIG. 8, illustrating the diffractive light modulator in a diffracting mode.
Figure 10:
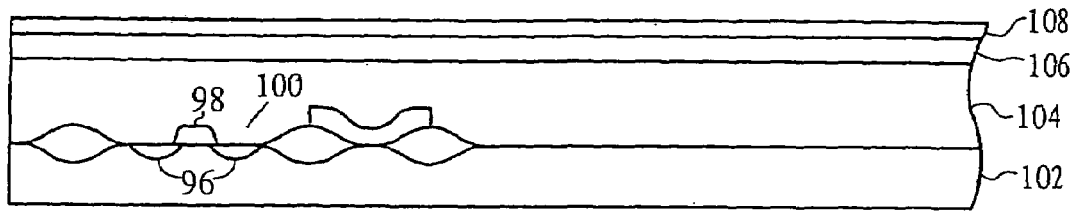
FIGS. 10-14 are cross-sections through a silicon substrate illustrating the front-end fabrication process of a monolithically integrated device according to the preferred embodiment of the present invention.

The first step in the front-end fabrication process, as illustrated in FIG. 10, is the fabrication of the front-end of a conventional MOS transistor 100. The MOS transistor 100 can be a p-type transistor or an n-type transistor. The transistor 100 is fabricated using conventional fabrication steps similar to those described above in relation to FIGS. 2 and 3. The transistor 100 includes a gate 98 and source-drains 96 fabricated onto silicon substrate 102. The configuration of transistor 100 as illustrated in FIGS. 10-20 is for illustrative purposes only and should not limit the scope of the present invention. Alternative conventional transistor configurations can be used in addition to or in replace of the transistor 100.

Following the fabrication of the front-end of transistor 100 onto the silicon substrate 102 is the deposition of an oxide layer 104 on the transistor 100 and silicon substrate 102. The oxide layer 104 is then planarized, where the thickness of the oxide layer 104 is a minimum amount sufficient for adequate planarization. The preferred method of planarizing the oxide layer 104, and subsequent oxide layers, is by chemical-mechanical polishing (CMP). Alternatively, any conventional method of planarizing can be used. As a result of the deposition and planarization of the oxide layer 104, the transistor 100 is sealed in a protective layer of oxide. Since the wafer is planar at this step, the wafer is in a desirable condition to begin fabrication of a front-end of the diffractive light modulator. If, instead, the fabrication of the diffractive light modulator is started directly on the transistor topology without first protecting the transistor 100 with the oxide layer 104, then the transistor 100 would most likely become damaged. Even if the transistor 100 were not damaged, significant processing difficulties would arise. These difficulties include removing the film from sidewalls of the various transistor elements. Removing the thin film from sidewalls can result in plasma damage, roughening of oxide, and other deleterious effects. Overcoming these difficulties, and others, adds complexity to the diffractive light modulator fabrication process. By isolating the transistor 100 within the protective layer of oxide, potential damaging aspects of the diffractive light modulator fabrication process are eliminated.

Figure 11:
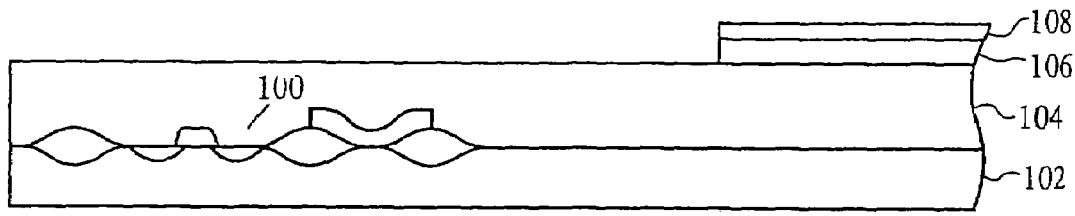

The next step is the deposition of a doped poly silicon layer on the oxide layer 104, followed by the deposition of an insulating layer, typically an oxide, on the doped poly silicon. Once patterned and etched, the poly silicon layer forms a bottom electrode 106 of the diffractive light modulator, and the insulating layer forms an etch stop 108, as illustrated in FIG. 11.

Figure 12:
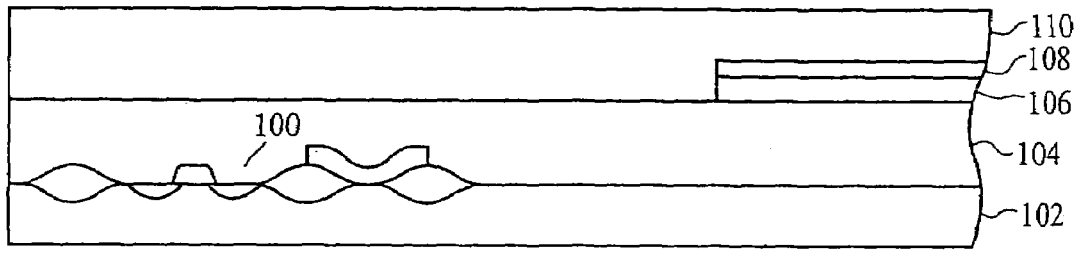
Figure 13:
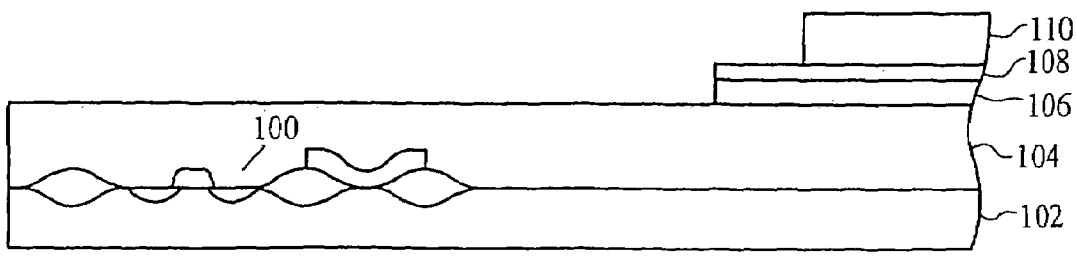
Figure 14:
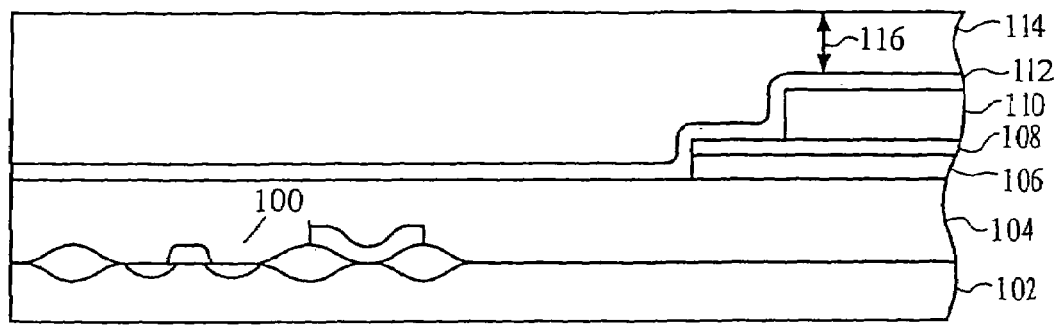

The next step, as illustrated in FIG. 12, is the deposition of a sacrificial layer 110. The sacrificial layer is then patterned and etched, as illustrated in FIG. 13. The next step, as illustrated in FIG. 14, is the deposition of a silicon nitride layer 112. The silicon nitride layer 112 is lithographically patterned into a grid of grating elements, the form of which is dependent upon the specifications of the particular diffractive light modulator necessary to perform the desired modulation of a light beam incident thereto. The FIGS. 10-18 illustrate a representative cross-section of the diffractive light modulator, and more particularly, an edge portion of the diffractive light modulator. It should be clear that this cross-section is exemplary only and is intended to aid in the understanding of the fabrication process. After this lithographic patterning process, a silicon nitride frame remains which acts as a relatively rigid support structure for some or all of the grating elements of the diffractive light modulator. The next step is the deposition of an oxide layer 114, which is then planarized. The oxide layer 114 is preferably planarized by CMP. As a result of the deposition and planarization of the oxide layer 114, the diffractive light modulator is embedded in a protective layer of oxide. It is necessary that the oxide layer 114 is of a minimum thickness 116 so that a subsequent over-etching step can be performed without damaging the silicon nitride layer 112. This over-etching step will be described in greater detail below. This completes the front-end fabrication process.

As described above, the front-end fabrication of the transistor and the front-end fabrication of the diffractive light modulator are performed using high-temperature processing steps. Preferably, in the front-end of the transistor, the silicon dioxide films are grown 800-1200 degrees C., the deposition of the gate is performed at 550-650 degrees C., and the source-drains are annealed at 800-1200 degrees C. The anneal temperature is determined based on the total thermal budget of the device fabrication process. To determine the anneal temperature, the thermal budget of the low-temperature processes associated with the back-end fabrication, and the thermal budget of the diffractive light modulator front-end fabrication processes are determined and subtracted from the total thermal budget. The result is the front-end transistor thermal budget. The anneal temperature is then determined based on the front-end transistor thermal budget. In the front-end of the diffractive light modulator, the deposition of the doped ploy silicon layer is performed at 550-650 degrees C. with a short anneal at 800-1200 degrees C., the deposition of the insulating layer is performed at 800-1200 degrees C., the deposition of the sacrificial layer is performed at 550-650 degrees C., and the deposition of the silicon nitride layer is performed at 700-900 degrees C. Each of the aforementioned temperature ranges are approximations. Each of the aforementioned deposition steps are preferably performed using low pressure chemical vapor deposition, or LPCVD. The preferred temperature ranges are the recommended temperature ranges for the processes described above. It is understood that other processes can be used to fabricate this or other types of transistors, where the other processes used are known to be conducted at different temperature ranges.

Figure 15:
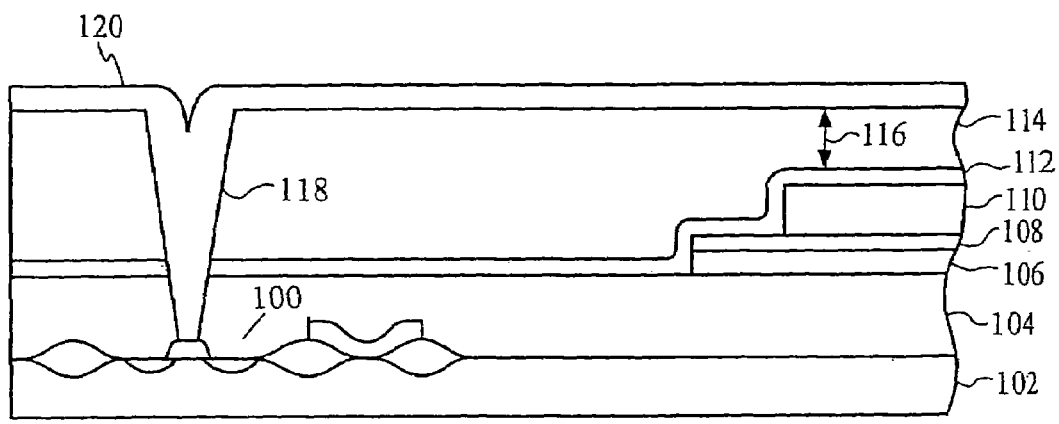
FIGS. 15-20 are cross-sections similar to that in FIGS. 10-14, illustrating the back-end fabrication process of the monolithically integrated device according to the preferred embodiment of the present invention.

The first step in the back-end fabrication process, as illustrated in FIG. 15, is the patterning and etching of a contact hole 118 to access the gate 98 of the transistor 100. The contact hole 118 includes an aspect ratio with a defined maximum, as is well known in the art. The maximum aspect ratio limits the maximum depth of the contact hole 118. It is a design consideration to account for this maximum depth when determining the thickness of the oxide layer 104 and the oxide layer 114, such that the depth of the contact hole 118 does not exceed the maximum depth permitted by the maximum aspect ratio of the contact hole 118. Following the etching of the contact hole 118 is the sputtering of a metal layer 120. Preferably, the metal is aluminum although other conductive metals can be used.

Figure 16:
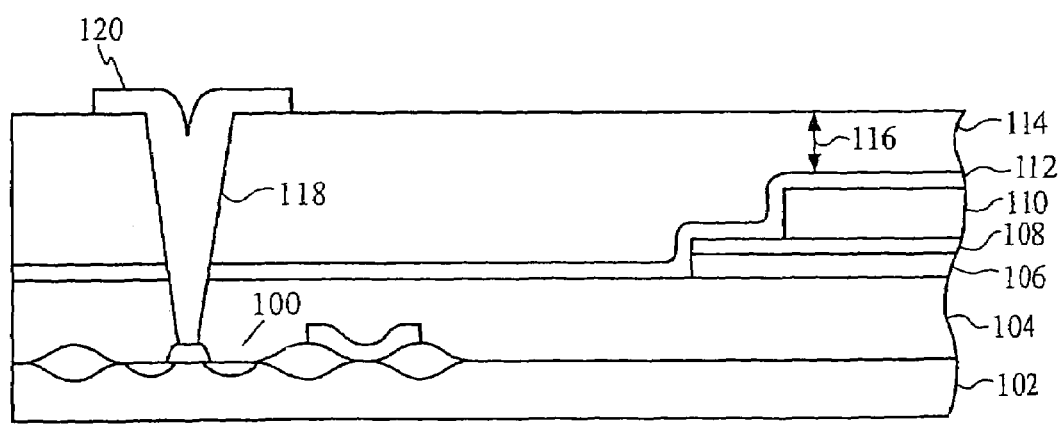

The next step, as illustrated in FIG. 16, is the patterning and etching of the metal layer 120 to form the first metal layer of an interconnect to transistor 100. Etching of the metal layer 120 is also necessary to remove the metal from the area above the diffractive light modulator. To ensure that all of the metal layer 120 that is not the interconnect is removed, over-etching into the oxide layer 114 is performed. Thus the need for the minimum oxide thickness 116 of the oxide layer 114 over the diffractive light modulator. The oxide thickness 116 acts as a buffer zone to allow for over-etching of the metal layer 120 without damaging the silicon nitride layer 112 of the diffractive light modulator. It should be clear that after the over-etching step is performed, the oxide thickness 116 is less than that before the over-etching step is performed.

Figure 17:
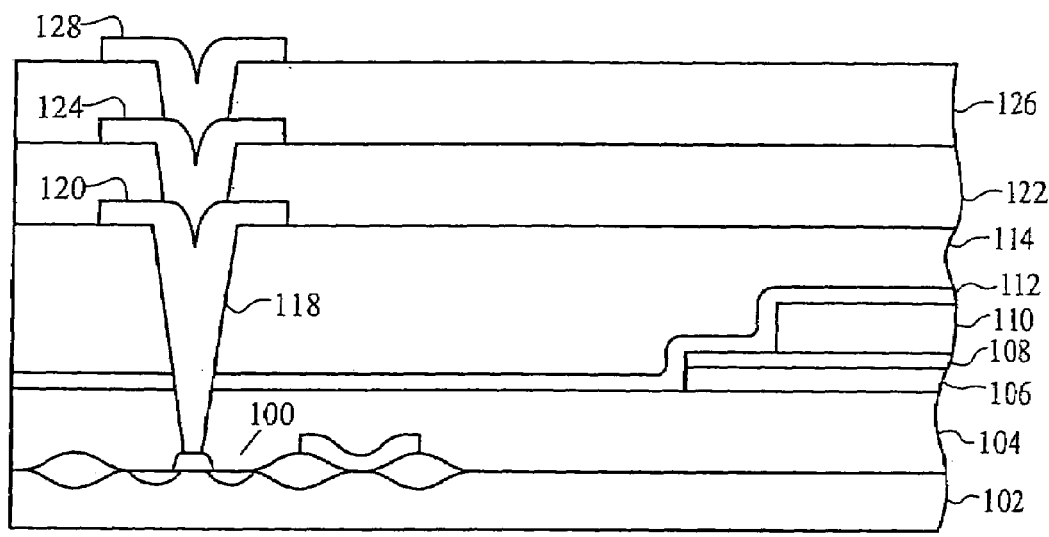

The next step, as illustrated in FIG. 17, is the deposition of an oxide layer 122. The oxide layer 122 is then planarized. The oxide layer 122 is preferably planarized by CMP. A contact hole is then patterned and etched to access the metal interconnect 120. Sputtering of another metal layer is then performed, which is then patterned and over-etched to form the second metal layer 124 of the interconnect to the transistor 100. As above, over-etching also removes the metal layer from the area above the diffractive light modulator. Following the fabrication of this second metal layer, a third metal layer is fabricated by repeating the steps of depositing an oxide layer (oxide layer 126), planarizing the oxide layer (preferably by CMP), patterning and etching a contact hole (to access the metal layer 124), sputtering a metal layer, patterning and over-etching the metal layer. In this manner, the third metal layer 128 is formed and the area above the diffractive light modulator is cleared of metal. The metal layers 120, 124 and 128 form an interconnect between the surface of the device and the gate 98 of the transistor 100. Although the interconnect illustrated in FIG. 17 consists of three metal layers, it should be clear to those skilled in the art that an interconnect can include more or less metal layers as necessary. Preferably, 3-5 metal layers are used to form the interconnects. These metalization layers are fabricated using low-temperature processing steps, as are well known in the art.

Figure 18:
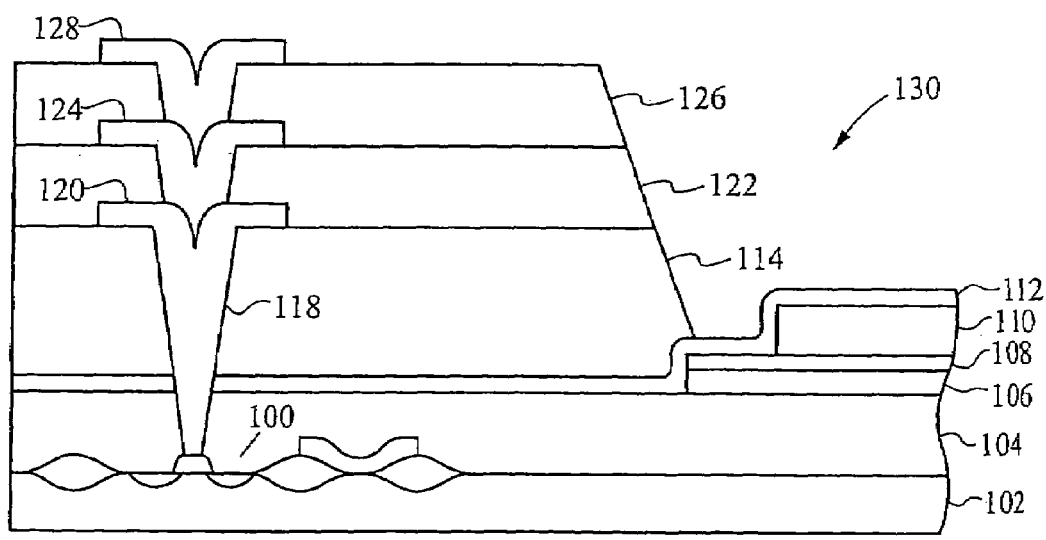

Once the interconnects for the transistor 100 are completed, all material above the diffractive light modulator is to be removed. This step, as illustrated in FIG. 18, is accomplished by applying a mask called an open array mask. The open array mask acts to protect the transistor 100 and associated interconnects while enabling the material above the diffractive light modulator to be removed. To remove the material above the diffractive light modulator, a wet dip is used. Preferably, the wet dip is a buffered oxide etch (BOE) wet etch. More preferably, the wet dip is a selective 10:1 BOE wet etch. Alternatively, the wet dip can be a 20:1 BOE wet etch, a 50:1 hydrofluoric (HF) wet etch, a pad etch, or any other similar hydrofluoric-based wet oxide etching chemistry. The wet dip enables selective etching to remove the material in an area 130 above the diffractive light modulator. Once the wet dip is performed, the area 130 is cleared and the diffractive light modulator is accessible.

Figure 19:
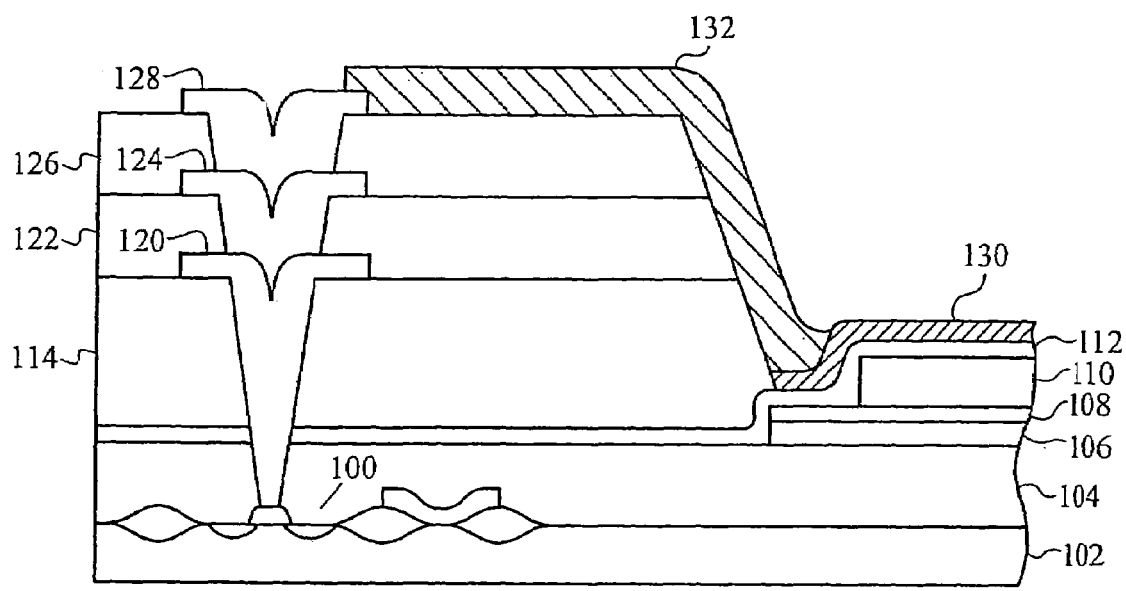
Figure 20:
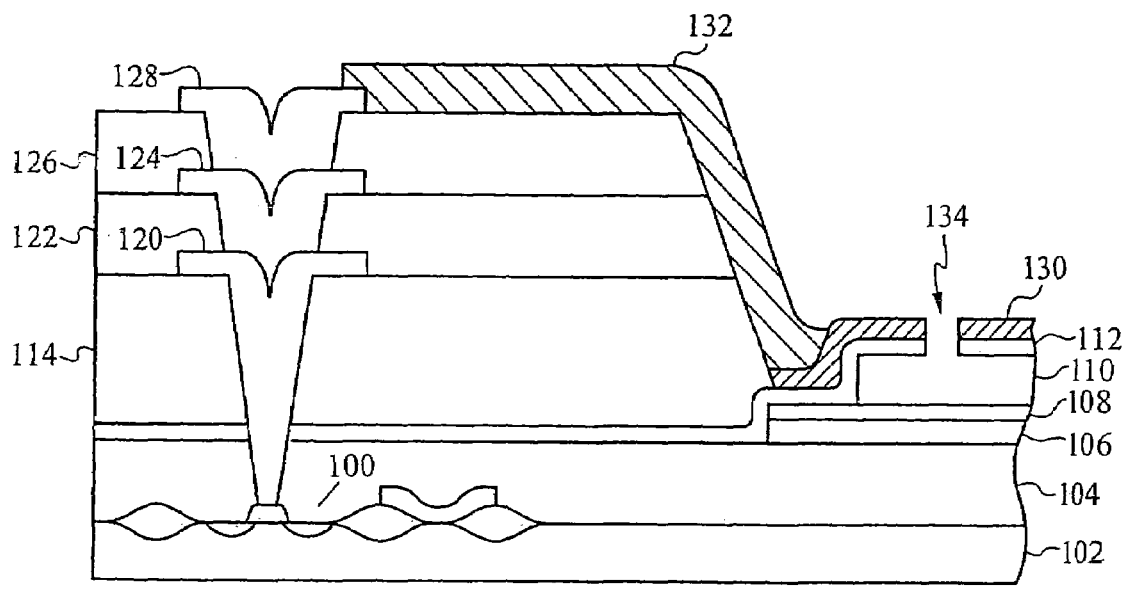

Metalization is then performed to form the reflective layers on the diffractive light modulator as well as to provide the metal pathways between the diffractive light modulator and the interconnects of the transistor 100. The metalization layer on the diffractive light modulator, as well as the metal pathways, are fabricated using low-temperature processing steps, which are compatible with the low-temperature processing steps used to form the metal layers of the transistor 100. After the area 130 is cleared, metalization of the diffractive light modulator is performed by sputtering, patterning and etching a reflective layer 130 onto the silicon nitride layer 112 of the diffractive light modulator, as illustrated in FIG. 19. The reflective layer 130 is preferably aluminum. Then, a thick metal layer 132 is sputtered, patterned and etched to form the metal pathways between the reflective layer 130 of the diffractive light modulator and the interconnects of the transistor 100. It is understood that any conventional method of metalizing the diffractive light modulator and the metal pathways can be used.

The diffractive light modulator is then completed by patterning and etching rib cuts 134 through selective areas of the reflective layer 130 and the silicon nitride 112, into which XeF2 is released to remove the sacrificial layer 110. A sealing process is then performed to complete the monolithically integrated device of the present invention.

There is a need to metalize the transistor separate from metalizing the diffractive light modulator. This is due to the nature of the wet dip used while applying the open array mask. As discussed above, the wet dip etches the oxide layers above the diffractive light modulator down to an etch stop, which is the silicon nitride layer 112. Using one of the etching chemistries described above, the selectivity of the oxide layer to silicon nitride is extremely high, on the order of 200 to 1. This is extremely effective in etching the oxide layer down to silicon nitride layer 112. However, these etching chemistries also etch metal to a large degree, particularly the thin and high quality metal deposited on the diffractive light modulator. Therefore, it is advantageous to not metalize the diffractive light modulator while metalizing the transistor. If the diffractive light modulator were metalized prior to applying the open array mask, then the etchant would etch the diffractive light modulator metal. Instead, after the transistor interconnects are formed, the open array mask with wet dip is applied to remove the oxide layers covering the front-end of the diffractive light modulator, and then the reflective layers of the diffractive light modulator and the metal pathways are formed.

The monolithically integrated device and the fabrication process associated therewith has been described related to a single transistor 100. This description is for illustrative purposes only and it should be clear that the preferred embodiment of the present invention includes a plurality of transistors and associated interconnects. It should also be clear that although the present invention has been described as including a single interconnect to gate 98, additional interconnects including the interconnects to the plurality of transistors are also included as required by the design considerations of the device. Additional interconnects to the silicon substrate can also be included, for example.

As can be appreciated by those of ordinary skill in the art reading the present disclosure, the above described techniques for fabricating an integrated device may be generally employed in the fabrication of micro-electro-mechanical system (MEMS) devices. For example, the above described techniques may also be employed in the fabrication of pressure and ultrasonic transducers. The fabrication of a sealed continuous membrane, rather than separated individual elements or ribbons, creates a device sensitive to pressure fluctuations. These devices are structurally very similar to the diffractive light modulators in that both devices have two parallel electrodes, with at least one of the electrodes being movable. The electrodes may be separated by a vacuum or gas. One example of such transducers is the capacitive micromachined ultrasonic transducers (CMUTs). CMUTs have been investigated in a number of places (see, for example, Oralkan, IEEE Transactions on Ultrasonics, Ferroelectrics, and Frequency Control, 49, No. 11, November 2002). If the transducer is applied to a low-speed, or dc, pressure wave, it detects changes in pressure and can be used as a pressure monitor. Although the name CMUT refers to transducers operating in the ultrasonic range, it should be understood that devices of this kind can be used at lower frequencies, in the audible or acoustic regime. They can be used to generate acoustic or ultrasonic waves, or to receive them, as a microphone, for example.

Generally speaking, CMUTs may be fabricated by micro-machining a membrane over a small gap (e.g., less than about 10 μm). The membrane serves as a top electrode, or as a support layer for a top electrode in the case of a multi-layer membrane. CMUTs may function as an ultrasound generator or detector. When a DC voltage is applied to the membrane, the resulting electric field pulls the membrane towards a bottom electrode, which may be fixedly formed on a layer overlying a substrate. Applying an AC signal voltage on the membrane causes the membrane to vibrate and emit ultrasound. The ultrasound may be employed in a variety of applications including ultrasonic imaging. In reverse, vibrations in the surrounding medium cause the membrane to move. This changes the capacitance formed by the membrane and the bottom electrode, allowing CMUT electronics to detect the change and generate a corresponding output current.

A CMUT device is nonlinear in that the displacement of the membrane depends nonlinearly on the applied voltage. A CMUT device can thus be analyzed as a top electrode on a spring, with a bottom electrode under the top electrode. The charge on the top electrode is given by EQ. 1:

$$Q = \frac{V \varepsilon A}{g} \quad \text{EQ. 1}$$

where "V" is the applied voltage, "$\varepsilon$" the dielectric constant of the medium between the top and bottom electrodes, "A" is the area of the top electrode, and "g" is the gap between the top and the bottom electrodes. The force on the top electrode is then given by EQ. 2:

$$F = k(g - G) + \frac{Q^2}{2\varepsilon A} = 0 \quad \text{EQ. 2}$$

where "k" is the spring constant holding up the top electrode, and "G" is the gap between the top and the bottom electrodes at rest (i.e., zero voltage or zero applied external force). In steady state, the force on the top electrode is zero and EQ. 2 can be rearranged to EQ. 3:

$$g^3 - Gg^2 + \frac{4}{27} \frac{V^2}{V_s^2} G^3 = 0 \quad \text{EQ. 3}$$

where, $$V_s^2 = \frac{8kG^3}{27\varepsilon A} \quad \text{EQ. 4}$$

is the snap-down voltage. The snap-down voltage is the voltage where the electrostatic force exceeds the spring force, and the top electrode is pulled down ("snapped down") to contact the bottom electrode. The distance between the top and bottom electrodes abruptly decreases to zero at the snap-down voltage. Of course, in applications where there is an intermediate feature between the top and bottom electrodes, the top electrode moves towards the bottom electrode and stops to contact the intermediate feature at the snap-down voltage.

Figure 21:
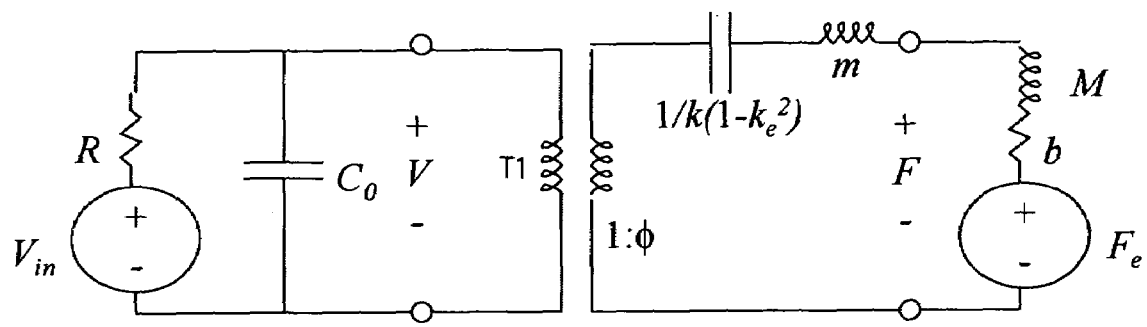
FIG. 21 shows a schematic diagram of an equivalent circuit for a CMUT device.

The utility of a CMUT device as an ultrasonic transducer is primarily dependent on the coupling between the electrical circuit (i.e., drive electronics) and the mechanical circuit (i.e., mechanical structure comprising the top and bottom electrodes) of the CMUT device. At zero applied voltage, there is no charge on the top electrode and thus no coupling between the electrical and mechanical circuits. Small movements of the top electrode about this point induce no currents in the electrical circuit, and small currents induce no movement of the top electrode. The electrical-mechanical coupling coefficient can be calculated by linearizing the electrical and mechanical circuits about an operating point and generating an equivalent circuit for both the electrical and mechanical components of the CMUT device. One such equivalent circuit is schematically shown in FIG. 21. In FIG. 21, "$C_O$" is the capacitance of the top electrode (Q/V), "$V_{IN}$" and "R" are the linearized characteristics of the electrical circuit driving the top electrode, "m" is the mass of the top electrode, and "M" and "b" are the mass and damping constant of the medium separating the top and bottom electrodes. "$F_e$" represents the external force applied on the top electrode.

In the equivalent circuit of FIG. 21, the circuit to the left of transformer T1 is the electrical circuit expressed in terms of voltage "V" and current "I". Because this electrical circuit is linearized about the operating point, the DC bias voltage "$V_0$" is not included in FIG. 21. To the right of transformer T1 is the mechanical circuit, where force replaces voltage and velocity replaces current. Transformer T1 has a turns ratio $\phi$, where $\phi$ has units of coulomb/meter ($\phi=Q_0/g_0$) and is a strong function of the bias voltage.

The true figure of merit for a transducer having an equivalent circuit like that of FIG. 21 is given by the coupling coefficient "$k_e$". For example, the sensitivity of a CMUT device is directly related to its coupling coefficient. The coupling coefficient appears in the equivalent circuit of FIG. 21 in the value given to the spring, $k(1-k_e^2)$. As the voltage "V" and the "$k_e$" increase, the mechanical force on the spring is balanced by the electrical force and the spring softens. This increases the effectiveness of the transducer because the membrane charge moves further for a given amount of external pressure change.

In the equivalent circuit of FIG. 21, the coupling coefficient is given by EQ. 5:

$$k_e^2 = \frac{\varepsilon A V_0^2}{g_0^2 k} = \frac{8 G^3 V_0^2}{27 g_0^3 V_S^2} \qquad \text{EQ. 5}$$

where "$\varepsilon$" is the dielectric constant of the medium between the top and bottom electrodes, "A" is the area of the top electrode, "$V_0$" is the DC bias voltage applied on the top electrode, "$g_0$" is the gap between the electrodes at the operating point, "k" is the spring constant holding up the top electrode, "G" is the gap between the top and the bottom electrodes at rest, and "$V_S$" is the snap-down voltage. Note that $k_e^2$ increases sharply as the voltage $V_0$ approaches the snap-down voltage $V_S$, with $k_e^2$ reaching the maximum value of 1.0 at the point where $V_0=V_S$.

The foregoing analysis depends on a number of simplifying assumptions, such as a spring force that depends linearly on position and a top electrode applying voltage at the bottom of the membrane (rather than a membrane that has an electrode on top). Also, the electrodes were assumed to be at constant separation, while in practice the top membrane takes a curved shape upon application of a voltage or pressure. However, some conclusions are relatively independent of the detailed assumptions including: (a) the coupling coefficient is zero at zero applied voltage and becomes unity only at the snap-down voltage; (b) the slope of the coupling coefficient increases sharply near the snap-down voltage; (c) therefore, an ultrasonic transducer that can operate close to the snap-down voltage has a higher coupling coefficient and can thus provide superior performance.

Unfortunately, operation near the snap-down voltage is relatively difficult. Firstly, the act of snapping down the membrane can be destructive in itself because the membrane can sometimes adhere to the lower electrode or substrate and become permanently attached thereto. Secondly, the properties of the membrane are quite different above the snap-down voltage, making the performance of the ultrasonic transducer difficult to predict. Thirdly, the coupling coefficient decreases again above the snap-down voltage (see Ergun, 2002 IEEE Ultrasonics Symposium, p. 1039). In addition, operation near the snap-down voltage is difficult because ultrasonic transducer elements are generally made from a number of membranes. If these membranes differ from one another, the snap-down voltage rating of the ultrasonic transducer will have to be reduced in order to keep all of the membranes operating below their respective snap-down voltages.

From the foregoing analysis, it is clear that ultrasonic transducers that are fabricated to provide very uniform snap-down voltages would provide superior performance. The inventors believe that conventional processes for fabricating ultrasonic transducers do not provide uniform snap-down voltages because these processes involve the use of non-uniform materials for membranes. For example, many conventional ultrasonic transducers have been fabricated with silicon nitride membranes deposited by PECVD (plasma-enhanced chemical vapor deposition) at relatively low temperatures of 250° C. to 450° C. Note that the use of plasma deposition processes, in general, allow for much lower deposition temperatures compared to LPCVD (low pressure chemical vapor deposition) and thermal processes. While these conventional membranes have reasonable mechanical properties, they suffer from variations in density and tension, both as deposited and over time (film stability). These variations can also be seen in the literature. For example, the paper by Oralkan cited above shows the dependence of membrane resonance frequency for different elements in a multi-element transducer. The reported standard deviation is 1% of the average value, despite the averaging over many individual membranes in each transducer element. This variation makes it difficult to operate the transducers within 10-20% of the snap-down voltage.

In addition to inferior control of stress and stoichiometry, and inferior long-term stability, PECVD films are typically not as uniform in thickness compared to films deposited using high temperature processes like those employed in embodiments of the present invention. Generally speaking, a high temperature deposition process such as LPCVD will produce conformal films over a very wide variety of surface topologies, and will yield films that are relatively uniform in composition and thickness.

Figure 22:
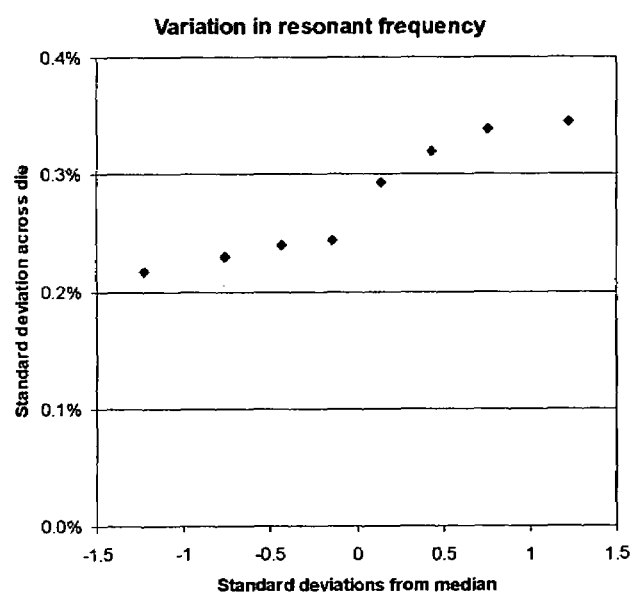
FIG. 22 shows a plot of variation in resonant frequency for movable elements comprising high temperature nitrides, in one experiment.

The process for fabricating diffractive light modulators disclosed herein has been demonstrated to produce membranes that are superior to those fabricated using conventional CMUT fabrication techniques. As discussed above, the front-end of a diffractive light modulator may be advantageously formed using high temperature deposition techniques, such as LPCVD or thermal deposition. For example, silicon nitride layer 112 (see FIG. 14) may be deposited by LPCVD at around 700° C. to 900° C. to obtain a relatively uniform "high temperature" nitride film. This results in movable elements that are more uniform compared to conventional CMUT membranes. Measurements of the resonance frequency of movable elements comprising high temperature nitrides show a standard deviation of 0.2% to 0.35%. This standard deviation is at least a factor of three better than those of conventional CMUTs with low-temperature nitrides. FIG. 22 shows a plot of variation in resonant frequency for movable elements comprising high temperature nitrides, in one experiment.

Figure 23:
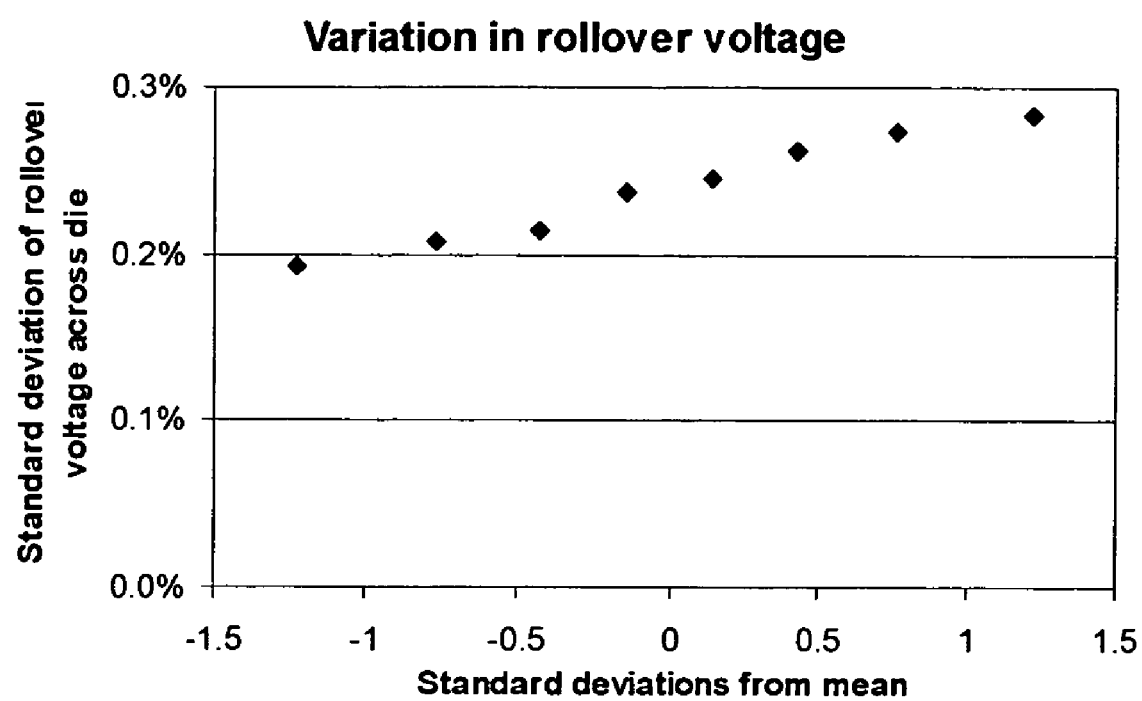
FIG. 23 shows a plot of variation in rollover voltage for movable elements comprising high temperature nitrides, in one experiment.

Other measurements show that movable elements comprising high temperature nitrides have very uniform properties. For example, one metric commonly used with diffractive light modulators is the so-called "rollover voltage." A rollover voltage is the voltage required to pull movable elements down by one-quarter wavelength in an optical application. The uniformity in this metric can be taken as equivalent to the uniformity in snap own voltage in an ultrasonic transducer application. FIG. 23 shows a plot of variation in rollover voltage for movable elements comprising high temperature nitrides, in one experiment.

Figure 24:
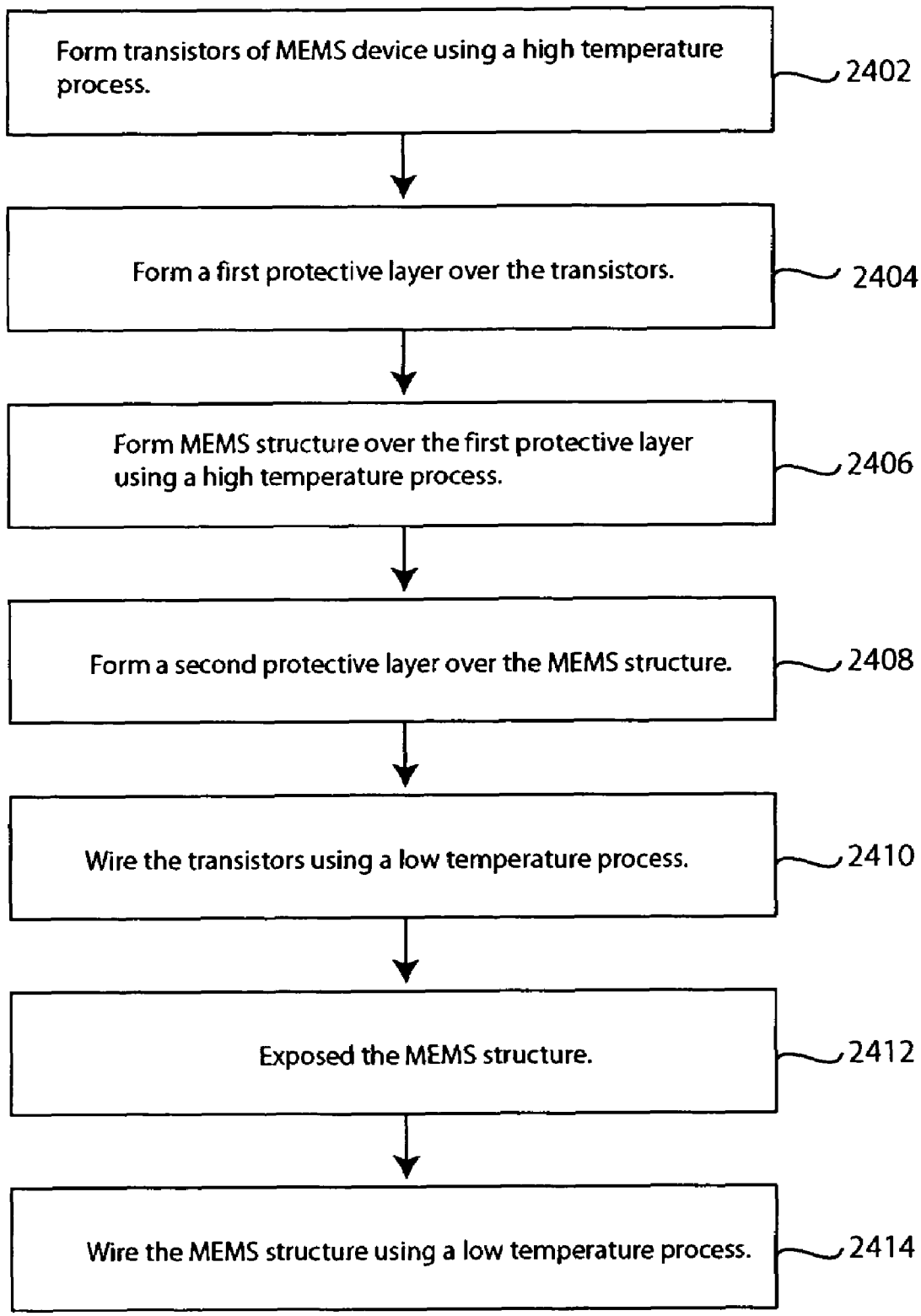
FIG. 24 shows a flow diagram of a method of fabricating an integrated MEMS device in accordance with an embodiment of the present invention.

From the above discussion, it can be seen that movable elements formed using high temperature processes as disclosed herein may be advantageously employed as CMUT membranes. FIG. 24 shows a flow diagram of a method of fabricating an integrated MEMS device, such as a diffractive light modulator, pressure transducer, or CMUT, in accordance with an embodiment of the present invention.

In step 2402, the transistors of a MEMS device are formed using a high temperature process as described in connection with FIG. 10. For example, in the fabrication of the transistors, silicon dioxide films may be grown at a temperature of about 800-1200° C., the deposition of gates may be performed at 800-1200° C., and the source-drains may be annealed at 800-1200° C. In step 2404, a first protective layer is formed over the transistors. The first protective layer is then planarized, preferably by chemical-mechanical polishing. Step 2404 corresponds to the formation of oxide layer 104 on transistor 100 as described in connection with FIG. 10. Steps 2402 and 2404 involve the formation of the front-end of the transistors.

In step 2406, the MEMS structure of the MEMS device is formed over the first protective layer using a high temperature process, such as LPCVD or thermal. Step 2406 corresponds to the formation of bottom electrode 106, etch stop 108, sacrificial layer 110, and silicon nitride layer 112 in FIGS. 10-14. Silicon nitride layer 112 may serve as a movable element of a diffractive light modulator, or as a movable membrane of a pressure transducer or CMUT device, for example. In the formation of the MEMS structures, bottom electrode 106 may be a doped polysilicon layer deposited by LPCVD at a temperature of about 550-650° C. with a short anneal at about 800-1200° C., etch stop 108 may be a silicon nitride layer deposited by LPCVD at about 800-1200° C., sacrificial layer 110 may be an amorphous silicon layer deposited by LPCVD at about 550-650° C., and silicon nitride layer 112 may be deposited by LPCVD at about 800-1200° C. Note that bottom electrode 106 may also comprise titanium nitride (TiN), for example. A high temperature nitride film, such as silicon nitride layer 112, provides superior performance compared to low temperature nitride films employed in conventional CMUT devices. The structural member of the top electrode may be silicon nitride, but it could also be silicon or other materials, or it could be a multi-layer structure.

In step 2408, a second protective layer is formed over the MEMS structure. The second protective layer is then planarized, preferably by chemical-mechanical polishing. Step 2408 corresponds to the formation of oxide layer 114 in FIG. 14. Steps 2406 and 2408 involve the formation of the front-end of the MEMS structure.

In step 2410, the transistors are wired using a low temperature process. A low temperature process includes those that employ plasma, such as PECVD for dielectric layers and PVD (physical vapor deposition) for metal layers. Step 2410 corresponds to the formation of metal layers 120, 124, and 128, contact hole 118, and oxide layers 122 and 126 in FIGS. 15-17. Step 2410 involves the formation of the back-end of the transistors.

In step 2412, the MEMS structure is exposed. This allows the MEMS structure to modulate incident light in the case of a diffractive light modulator, to transmit or receive pressure in the case of a pressure transducer, or to transmit or receive ultrasonic sound in the case of a CMUT device, for example. Step 2412 corresponds to the etching of oxide layers 114, 122, and 126 in FIG. 18.

In step 2414, the MEMS structure is wired to allow connection to the transistors and other nodes. The MEMS structure may be wired using a low temperature metallization process, such as PVD. Step 2414 corresponds to the formation of reflective layer 130 and metal layer 132 in FIG. 19. Thereafter, depending on the MEMS structure, a membrane (e.g., silicon nitride layer 112) of the MEMS structure is suspended over a gap, as described in connection with FIG. 20.

Techniques for fabricating an integrated device have been disclosed. While specific embodiments have been provided, these embodiments are for illustration purposes and not limiting. Many additional embodiments will be apparent to persons of ordinary skill in the art reading this disclosure.

We claim:

1. A method of fabricating an integrated device, the method comprising:
    forming a transistor of an integrated device;
    forming a first protective layer over a gate, source, and drain of the transistor;
    forming a micro-electro-mechanical system (MEMS) structure over the first protective layer, the MEMS structure including a movable element that is formed using a deposition process at a temperature greater than about 700° C.;
    forming a second protective layer over the MEMS structure;
    wiring the transistor to allow electrical connection to the transistor; and
    removing at least a portion of the second protective layer to expose the MEMS structure.

2. The method of claim 1 wherein the movable element comprises a membrane of a capacitive micromachined ultrasonic transducer (CMUT).

3. The method of claim 1 wherein the integrated device comprises a CMUT.

4. The method of claim 1 wherein the deposition process comprises low-pressure chemical vapor deposition (LPCVD).

5. The method of claim 1 further comprising:
    suspending the movable element over a bottom electrode.

6. The method of claim 5 wherein the bottom electrode comprises doped polysilicon.

7. A method of fabricating an integrated device, the method comprising:
    forming a plurality of transistors of an integrated device;
    forming a protective layer over the plurality of transistors after the plurality of transistors is formed;
    forming a capacitive micromachined ultrasonic transducer (CMUT) over the protective layer, the CMUT including a membrane that is formed using a high temperature process performed at a temperature greater than 700° C., the plurality of transistors and the CMUT being formed on a same substrate;
    forming a second protective layer over the CMUT;
    forming an interconnect line to a transistor in the plurality of transistors; and
    removing at least a portion of the second protective layer to expose the CMUT.

8. The method of claim 7 wherein the membrane is suspended over a gap.

9. The method of claim 7 wherein the high temperature process comprises low pressure chemical vapor deposition (LPCVD).

10. The method of claim 7 further comprising:
    wiring the CMUT using a low temperature process performed at a temperature lower than 700° C.

11. The method of claim 10 wherein the low temperature process includes plasma processing.

* * * * *